(12) United States Patent
Pumyea et al.

(10) Patent No.: US 8,643,266 B2
(45) Date of Patent: Feb. 4, 2014

(54) LIGHT-EMITTING DEVICE INCLUDING INDEPENDENTLY ELECTRICALLY ADDRESSABLE SECTIONS

(75) Inventors: Warren P. Pumyea, Gardner, MA (US); Michael Lim, Cambridge, MA (US); Hong Lu, Belmont, MA (US); Alexei A. Erchak, Cambridge, MA (US)

(73) Assignee: Luminus Devices, Inc., Billerica, MA (US)

( * ) Notice: Subject to any disclaimer, the term of this patent is extended or adjusted under 35 U.S.C. 154(b) by 1021 days.

(21) Appl. No.: 12/566,642

(22) Filed: Sep. 24, 2009

(65) Prior Publication Data

US 2010/0219767 A1    Sep. 2, 2010

Related U.S. Application Data

(60) Provisional application No. 61/099,755, filed on Sep. 24, 2008.

(51) Int. Cl.
*H01J 1/62*  (2006.01)

(52) U.S. Cl.
USPC ............................. 313/501; 313/504; 313/506

(58) Field of Classification Search
USPC ............ 313/112, 501, 504, 506, 507; 257/89, 257/E33.061
See application file for complete search history.

(56) References Cited

U.S. PATENT DOCUMENTS

| | | | |
|---|---|---|---|
| 6,071,795 A | 6/2000 | Cheung et al. | |
| 6,420,242 B1 | 7/2002 | Cheung et al. | |
| 6,608,439 B1 * | 8/2003 | Sokolik et al. | 313/512 |
| 6,628,068 B1 * | 9/2003 | Rorison et al. | 313/504 |
| 6,828,724 B2 * | 12/2004 | Burroughes | 313/503 |
| 6,831,302 B2 | 12/2004 | Erchak et al. | |
| 6,900,587 B2 * | 5/2005 | Suehiro et al. | 313/503 |
| 7,166,871 B2 | 1/2007 | Erchak | |
| 7,196,354 B1 | 3/2007 | Erchak et al. | |
| 7,344,903 B2 | 3/2008 | Erchak et al. | |
| 7,450,311 B2 | 11/2008 | Erchak et al. | |
| 7,781,779 B2 | 8/2010 | Nemchuk | |
| 8,217,402 B2 | 7/2012 | Nemchuk | |
| 2003/0214233 A1 * | 11/2003 | Takahashi et al. | 313/512 |
| 2004/0130263 A1 * | 7/2004 | Horng et al. | 313/506 |
| 2006/0022214 A1 | 2/2006 | Morgan et al. | |
| 2007/0075627 A1 * | 4/2007 | Kimura et al. | 313/503 |
| 2007/0085098 A1 | 4/2007 | Erchak et al. | |
| 2007/0223219 A1 | 9/2007 | Medendorp, Jr. et al. | |

(Continued)

FOREIGN PATENT DOCUMENTS

WO    WO 2006/136965 A2    12/2006
WO    WO 2007/034367 A1    3/2007

OTHER PUBLICATIONS

International Search Report and Written Opinion from PCT/US2009/05332, mailed Nov. 25, 2009.

(Continued)

*Primary Examiner* — Tung X Le (74) *Attorney, Agent, or Firm* — Wolf, Greenfield & Sacks, P.C.

(57) ABSTRACT

Light-emitting devices are described herein. Some embodiments relate to light-emitting diodes with light-emitting sections that are independently electrically addressable. The devices may be used in a variety of applications including illumination and general lighting.

23 Claims, 10 Drawing Sheets

(56) References Cited

U.S. PATENT DOCUMENTS

| | | |
|---|---|---|
| 2007/0273290 A1 | 11/2007 | Ashdown et al. |
| 2008/0122376 A1 | 5/2008 | Lys |
| 2008/0237614 A1* | 10/2008 | Ishikura et al. .................. 257/89 |
| 2009/0166644 A1* | 7/2009 | Hiroyama et al. .............. 257/84 |
| 2010/0219426 A1* | 9/2010 | Kim et al. ....................... 257/88 |

OTHER PUBLICATIONS

Office Action from Chinese Application No. 200980147779.7, mailed Mar. 29, 2013.

* cited by examiner

LIGHT-EMITTING DEVICE INCLUDING INDEPENDENTLY ELECTRICALLY ADDRESSABLE SECTIONS

RELATED APPLICATIONS

This application claims priority to U.S. Provisional Application No. 61/099,755, filed Sep. 24, 2008, which is incorporated herein by reference in its entirety.

FIELD

The present embodiments are drawn generally towards light-emitting devices, and more specifically to light-emitting diodes with light-emitting sections that are independently electrically addressable.

BACKGROUND

A light-emitting diode (LED) can provide light in a more efficient manner than an incandescent and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into regions (e.g., quantum wells) for relatively efficient conversion to light. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

In order to produce desired light, wavelength converting materials such as phosphors is disposed over the light emission surface of an LED. This technique has been used to produce white light from a single diode. Yellow-white light-emitting LED is produce by coating an LED emitting light of a wavelength of 470 nm (blue light) with a yellow emitting phosphor. However the resultant white light does not have the necessary color temperature to be used in most general lighting applications.

When white light-emitting devices are used for general lighting applications, a high color rendering white light may be desired. Generally, color rendering refers to how natural the colors of objects look under a given illumination and can be an important characteristic for light sources for general lighting. Color rendering is measured by the general Color Rendering Index (CRI). As used herein, the general color rendering index refers to a method for describing the effect of a white light source on the color appearance of objects. Specifically, Ra is a measure of the average appearance of eight standardized colors chosen to be of intermediate saturation and spread throughout the range of hues. Luminous efficacy is the ratio of luminous flux (lumen) emitted by the source to the input electrical power (watt). Color Temperature (CT) is the appearance of light emitted from a white light source. It defines how warm or how cold a certain white light may appear. In addition to a high color rendering, a good luminous efficacy may be desired, as well as a color temperature that represents the desired lighting application. A white light that contains all these attributes is considered a color balanced white light. Different amounts of each attribute may be needed for different lighting application such as indoor or outdoor lighting, office or home lighting.

SUMMARY

Light-emitting devices are described herein.

In one set of embodiments, a light-emitting device is provided. The light-emitting device comprises a light-emitting diode designed to emit light. The light-emitting diode includes at least a first light-emitting section and a second light-emitting section. The first and second light-emitting sections are configured to be independently electrically addressable. At least one of the light-emitting sections including a wavelength converting material layer through which light passes.

In another set of embodiments, a light-emitting device is provided. The light-emitting device comprises a light-emitting diode designed to emit light. The light-emitting diode includes at least a first light-emitting section and a second light-emitting section. Each of the first and the second light-emitting sections have two electrical contacts associated therewith, wherein at least one of the electrical contacts associated with the first light-emitting section is different than the electrical contacts associated with the second light-emitting section. At least one of the light-emitting sections including a wavelength converting material layer through which light passes.

In another set of embodiments, a method is provided. The method comprises providing a light-emitting device comprising a light-emitting diode designed to emit light. The light-emitting diode includes at least a first light-emitting section and a second light-emitting section. At least one of the light-emitting sections include a wavelength converting material layer through which light passes. The method further comprises providing current to the first light-emitting section separately from providing current to the second light-emitting section.

In some embodiments, light emitted from the first light-emitting section has a different wavelength than light emitted from the second light-emitting section. In some embodiments, light emitted from the first light-emitting section has a different color temperature than light emitted from the second light-emitting section.

In some embodiments, the light-emitting device comprises an array of light-emitting diodes. The light-emitting diodes in the array can include at least a first light-emitting section and a second light-emitting section, the first and second light-emitting sections are configured to be independently electrically addressable.

In some embodiments, the light-emitting diode includes at least five light-emitting sections configured to be independently electrically addressable. In some embodiments, at least two of the light-emitting sections include a wavelength converting material layer through which light passes.

In some embodiments, the light-emitting diode is configured to emit white light. For example, the light emitted from each of the light-emitting sections can be combined to form the white light. In some embodiments, at least one of the light-emitting sections is configured to emit light to color balance the light emission from the light-emitting diode. In some cases, the light emitted from each of the light-emitting sections is mixed to produce a single color of visible light.

In some embodiments, the light-emitting die has a light emission surface greater than one square millimeter. In some embodiments, the area of the first and second light-emitting sections is greater than about 200 micron.

In some embodiments, the wavelength converting material comprises a phosphor material.

In some embodiments, the light-emitting device further comprises a submount, wherein the light-emitting diode is mounted on the submount.

In some embodiments, one or more of the light-emitting sections are devoid of wavelength converting material.

In some embodiments, the light-emitting diode comprises a first light-emitting section comprising a red wavelength converting material layer; a second light-emitting section comprising an amber or yellow-green wavelength converting material; and, a third light-emitting section devoid of wavelength converting material positioned adjacent to at least one of the other light-emitting sections.

In some embodiments, the light-emitting device further comprises a close proximity optical element disposed over at least a portion of the light emission area in the optical pathway of the emitted light.

In some embodiments, the light-emitting devices is a component of an illumination assembly.

In some embodiments, the light-emitting devices is a component of a general lighting assembly.

In some embodiments, a different current level is provided to the first light-emitting section than the second light-emitting section.

In some embodiments, the method further comprises controlling the current levels provided to the first light-emitting section and the second light-emitting section to control the wavelength of the light emitted by the light-emitting diode.

Other aspects, embodiments and features of the invention will become apparent from the following detailed description of the invention when considered in conjunction with the accompanying figures. The accompanying figures are schematic and are not intended to be drawn to scale. In the figures, each identical or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Figure 1A:
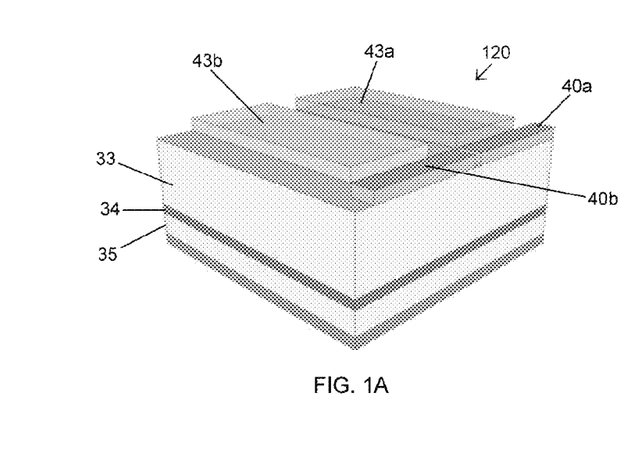
FIG. 1A-1C are views of a light-emitting diode, in accordance with one embodiment.
Figure 1B:
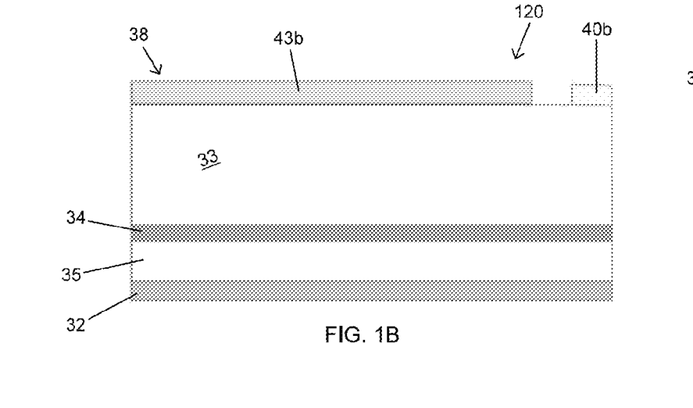
Figure 1C:
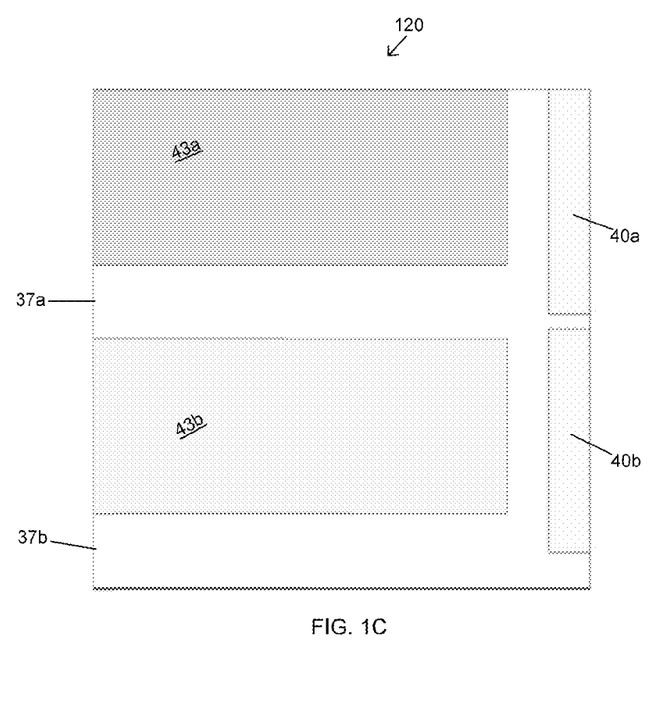

FIGS. 1A-1C illustrate a light-emitting device including a light-emitting die 120.

Light-emitting die 120 may be a light-emitting diode (LED) die or laser diode die. Light-emitting die 120 can include semiconductor layers 33, 34, and 35. Layer 34 may be a light-generating region, also referred to as an active region which can include one or more quantum wells. Semiconductor layer 33 can be a semiconductor of a first conductivity type (e.g., n-type or p-type) and semiconductor layer 32 can be a semiconductor of a second conductivity type (e.g., p-type or n-type), thereby forming a p-n junction where the light-generating region can be disposed between the n-type and p-type regions. Semiconductor layer 33 can be attached to a layer 32 which can be an electrical contact. Layer 32 may also function as a reflective layer(s) (e.g., a metal layer stack, a dielectric or semiconductor multilayer mirror) and/or a supporting submount layer (e.g., one or more metal layers, such as a copper or copper-tungsten submount). Layer(s) 32 can be in contact with the semiconductor layer 33. The submount and/or any to reflective layers disposed under semiconductor layer 33 can be electrically conductive, thereby providing for electrical contact to the semiconductor layer 33.

Light-emitting die 120 includes a first light-emitting section 37a and a second electrical section 37b. Each of light-emitting sections have an electrical contact 40a, 40b formed on respective surfaces of each section. Contacts 40a and 40b are light-emitting from one another. Contacts 40a, 40b and contact 32 function to provide power to the light-emitting sections to generate light as described further below. Such a contact arrangement enables current to be provided independently to light-emitting sections 37a, 37b. That is, the current to light-emitting section 37a may be provided independently from the current provided to light-emitting section 37b. Thus, the light-emitting sections are referred to as being independently electrically addressable. In these embodiments, different current levels may be provided to the different light-emitting sections. This enables different light (e.g., having different wavelengths) to be emitted from each section. Light is emitted through include an emission surface 38.

In the illustrative embodiment, contact 32 functions as a backside contact for both the first section 37a and second section 37b, though it should be understood that separate backside contacts for the first section and the second section may be provided.

It should be understood that the die may includes additional light-emitting sections which may be independently electrically addressable by having at least one of their own respective electrical contacts.

In this illustrative embodiment, the light-emitting device includes a single light-emitting die (e.g., light-emitting diode). It should be understood, however, that other embodiments may include more than one light-emitting die, for example, arranged in an array.

Sections 37a, 37b may have any suitable dimensions. In some cases, the area of the sections is greater than 200 micron (e.g., between 200 micron and 1000 micron); in some cases, the area of the sections is greater than 500 microns (e.g., between 200 micron and 1000 micron). In some cases, the area of the sections may be substantially equal, but in other cases, the area of the sections may be different.

Light-emitting die 120 may be formed by transferring semiconductor layers onto a supporting submount, for example, by using a grinding, etching, and/or laser liftoff process. Laser liftoff processes are disclosed, for example, in U.S. Pat. Nos. 6,420,242 and 6,071,795, which are hereby incorporated by reference in their entirety. It should be appreciated that other methods of forming the light-emitting die 120 are possible, as the embodiments presented herein are not limited in this respect.

In some embodiments, the light-emitting die can be a large-area die have an emission area greater than or equal to about 1 mm$^2$. In some embodiments, the light-emitting die emission area can be greater than 3 mm$^2$. In some embodiments, the light-emitting die emission area can be greater than or equal to 5 mm$^2$. In some embodiments, the light-emitting die emission area can be greater than 10 mm$^2$. A large-area light-emitting die can facilitate the packaging of such dies as a chip-scale packaged light-emitting device, such as the packaged light-emitting devices described herein. Extraction of light from large-area light-emitting dies can be facilitated by the presence of one or more light extraction features. In some embodiments, the one or more light extraction features comprise a roughed surface (e.g., a rough emission surface). In some embodiments, the one or more light extraction features comprise a patterned surface (e.g., a patterned emission surface), as described further below in detail.

In the illustrative embodiment, a wavelength converting material layer 43a is formed on a surface of section 37a and a wavelength converting material layer 43b is formed on a surface of section 37b. Light generated within each section 37a, 37b passes through the respective wavelength converting material layer 43a, 43b. Though in this embodiment, the light-emitting sections are shown to include wavelength converting material layers, it should be understood that in other embodiments, one or more of the light-emitting sections may be devoid of a wavelength converting material layer. That is, one or more of the light-emitting sections may not include a wavelength converting material layer and may emit light that is not wavelength converted.

The wavelength converting material layer(s) may include one or more phosphors and/or quantum dots. In some embodiments, phosphors are preferred. Suitable wavelength converting materials and phosphors have been described in commonly-owned U.S. Pat. No. 7,196,354 which is incorporated herein by reference in its entirety. The wavelength converting material layer(s) can absorb light emitted by the light-generating region of the LED and emit light having a different wavelength than that absorbed. In this manner, LEDs can emit light of wavelength(s) (and, thus, color) that may not be readily obtainable from LEDs that do not include wavelength converting material layers. In some embodiments, one or more wavelength converting material to layers may be disposed over (e.g., directly on) the emission surface (e.g., surface 38) of the light-emitting device.

In some preferred embodiments, the wavelength-converting material can convert ultra-violet or near ultra-violet light to light in the visible spectrum. The wavelength converting material can down-convert light from shorter wavelengths (higher energies) to longer wavelengths (shorter energies). Phosphors are examples of typical wavelength converting materials, which can take the form of phosphor particles. Quantum dots can also serve as wavelength converting materials. In some preferred embodiments, the wavelength-converting material is a phosphor material. In other preferred embodiments, a combination of phosphors can be used to create visible light emission of a desired wavelength.

In some embodiments, the phosphor material may be present in particulate form. The wavelength converting material layers may be formed by a number of methods. Methods such as printing, molding (e.g., injection molding), spin coating, spraying, stenciling, spin-on glass, electroforming, injection molding, and thin layer deposition. and/or embossing may be employed. For example, a printing process (e.g., a jet printing process) may be used to create wavelength converting material having a spatially varying density. The printer cartridge may include a solution comprising the wavelength converting material (e.g., phosphor and/or quantum dots). Varying thickness of a wavelength converting material layer can then be created by performing a longer printing step at different locations. Alternatively, or additionally, small features (e.g., dots, stripes) with small sizes (e.g., less than 500 microns, less than 200 microns, less than 100 microns) can be printed with a spatially varying nearest neighbor distance. In other embodiments, wavelength converting material may be included in a molding material (e.g., a polymer such as PMMA or acrylic) so as to have a varying density at different locations of the molded component, such as a molded light guide. The particles may be distributed in a second material (e.g., an encapsulant or adhesive, such as epoxy) to form a composite structure or a plate.

In one embodiment, the wavelength converting material may be a polycrystalline or a single crystalline phosphor material. The crystalline wavelength converting material layer may be attached to the surface of the light-emitting device by various techniques such as wafer bonding, sintering and gluing. In one embodiment, the crystalline layer may be attached to the emission surface 38 by a boding layer (not shown). In another to embodiment, the crystalline wavelength converting material layer may be formed by using high pressure at room temperature while pressing a phosphor material together with another softer material such as salt in order to form a layer. Heat and pressure can be used to form this same layer in a form of a ceramic.

In some embodiments, wavelength converting material of different thickness may be applied onto a top surface of the wafer in order to achieve a desired color point of emitted light. In other embodiments, the wavelength converting material can be disposed on a top surface of the wafer according to a pattern, wherein the pattern is in the form of rings, concentric ridges, squares, rectangles or any shape imaginable. The pattern may be pre-determined.

In another embodiment, the light-emitting device may include a thermally conductive region in contact with a wavelength-converting region. The thermally conductive region may include a single material layer, multiple material layers, or a portion of a layer. Thermally conductive region can aid in the extraction of heat from the wavelength-converting region, which can enable operation at higher power and/or higher brightness of generated light. Thermal management is also significantly beneficial because temperature affects dominant wavelength and light-emitting device intensity. High temperature could shift the dominant wavelength thereby changing the color output by the light-emitting device. Additionally, high temperatures could degrade the light-emitting device over time reducing the total lifetime of the device.

In some embodiments, the different light-emitting sections may produce light of different wavelengths. The different wavelengths mix together to produce a single color of visible light. The light-emitting sections are powered at different current levels. By controlling the different current levels of the separate light-emitting sections the light-emitting device can be tuned to a variety of colors on a large color gamut. The light-generating region has a patterned surface that acts as a dielectric function in aiding light created by the light-emitting device to escape the light-generating region.

By independently addressing the isolated sections of the light emission area, a single diode can function as multiple diodes in a single package. Each of the sections can be configured to emit light of different color which mixes together to create a single emitted light out of the light-emitting diode. In one embodiment, the separate sections can be powered independently at different current levels. By powering different sections independently and controlling the wavelength and intensity of light produced by those to sections, the light-emitting device can be tuned to a variety of colors on a large color gamut.

The dominant wavelength of a light-emitting device changes with the forward current. FIG. 2B shows a response curve of a typical red light-emitting device. As it can be seen there is a positive correlation between forward current and dominant wavelength. By incrementally changing the forward current to the separate sections the ideal dominant wavelength for each section can be achieved, which results in the ideal color point for the light-emitting device. The dominant wavelength also changes due to temperature and heat over time, changing the output light of the light-emitting device. These effects could be negated by tuning the light-emitting device to the dominant wavelength it contained when it was first installed.

In one embodiment, the separation can be accomplished by creating separate electrical connections into each of the multiple isolated sections on the same submount layer. In one embodiment, the sections can be isolated by splitting the multi-stack of materials of diode after the diode is formed into the desired number of sections.

Figure 2A:
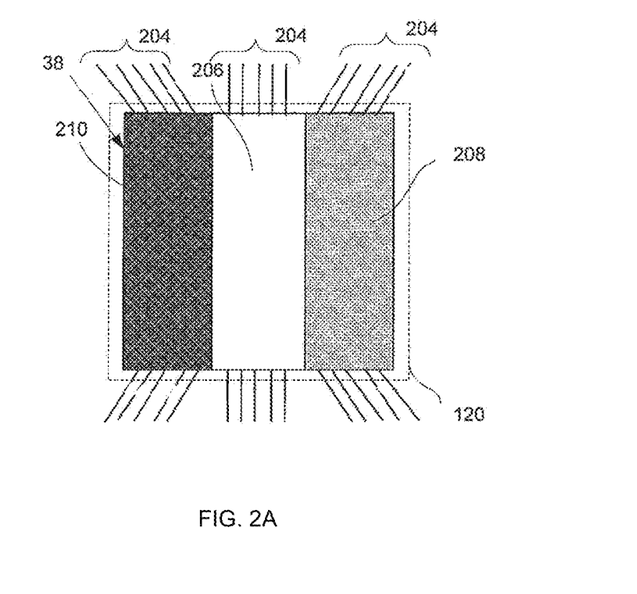
FIG. 2A is a top-view of a light-emitting diode, in accordance with one embodiment.
Figure 2B:
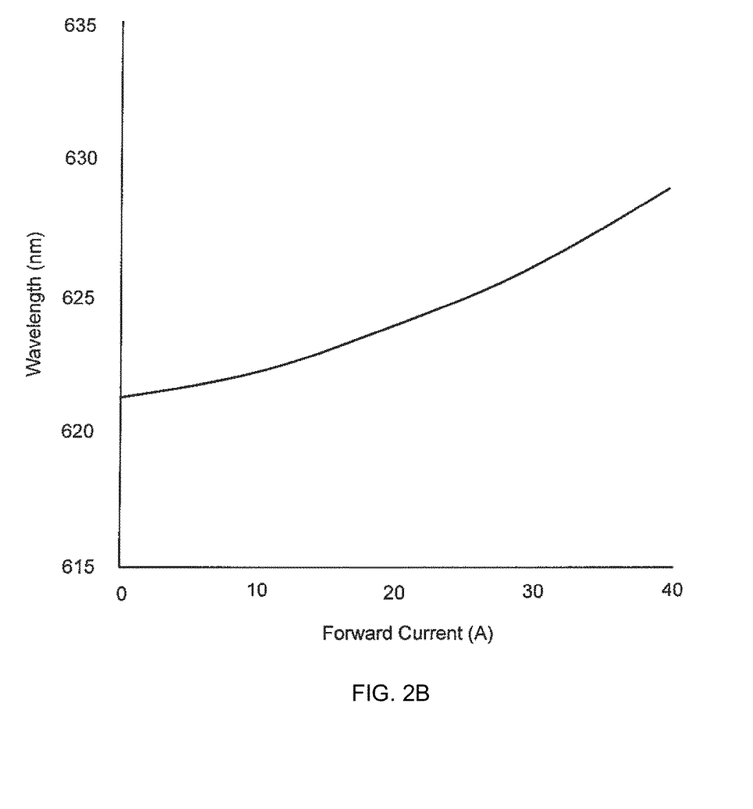
FIG. 2B is a graphical representation of response curve of a typical red light-emitting device, in accordance with one embodiment.

FIG. 2A illustrates a top-view of the light-emitting device including three light-emitting sections 210, 206 and 208 formed on the light emission surface 38. Each of the sections are independently addressed by separate groups of electrical connections 204. Each sections may be driven at a different forward current level. For example, forward current levels may be anywhere between 0 amperes (A or amps) and 35 A. In one embodiment, the light-emitting device emits light in the blue, near-ultraviolet regions of the electromagnetic spectrum in the range between about 400 nm and about 450 nm.

FIG. 2A further illustrates three different wavelength converting material layers being disposed over the three sections 210, 206 and 208. For example, section 210 may comprise a red wavelength converting material; section 206 may comprise a wavelength converting material selected from the group consisting of blue and cyan phosphors; and, section 208 may comprise a wavelength converting material selected from the group consisting of amber and yellow-green phosphors. Alternatively, section 206 may be devoid of wavelength converting material, emitting the light directly from emission surface 38.

Figure 3A:
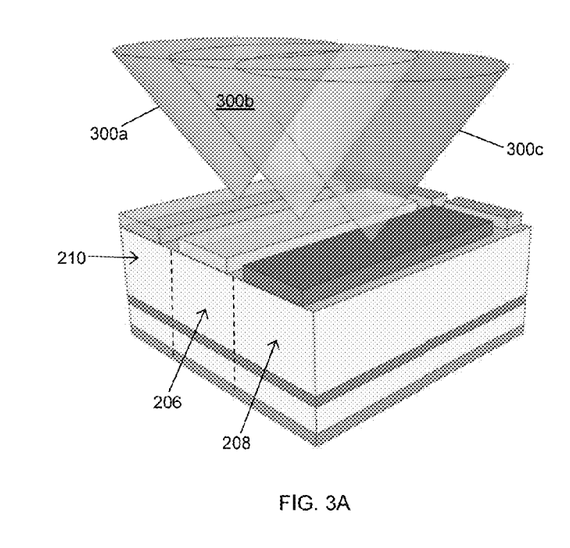
FIG. 3A is a perspective view of a light-emitting device with different wavelength converting materials disposed on the light-emitting device, in accordance to with one embodiment.

FIG. 3A is a perspective view of a light-emitting device with different wavelength converting materials disposed over three sections, in accordance with one embodiment. Light emitted out the light-emitting sections 210, 206 and 208 is converted to by the wavelength converting material disposed over the isolated section 210, 206 and 208. Each section produces a light of a different wavelength 300a, 300b, and 300c respectively. The new converted light 300a, 300b, and 300c can mix together to produce a single color of visible light. Forward current to each section could then be increased or decreased accordingly to create the desired color point.

Figure 3B:
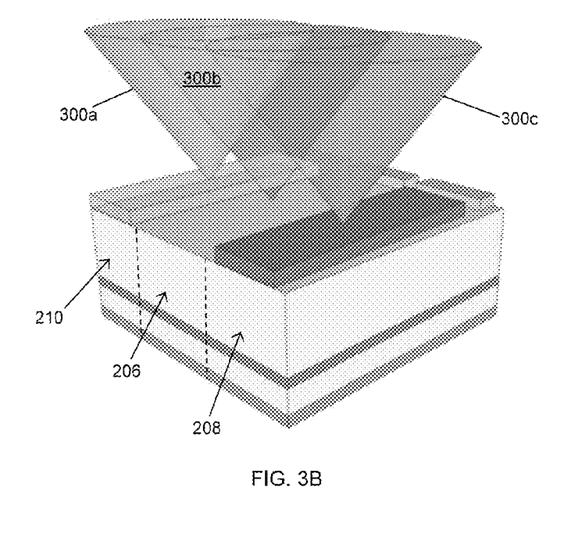
FIG. 3B is a perspective view of a light-emitting device with different wavelength converting materials disposed on the light-emitting device, in accordance with one embodiment.

Alternatively, as shown in FIG. 3B, one or more of the light-emitting sections can be devoid of wavelength converting material. Specifically, converted light 300a and 300c emitted from sections, 210 and 208, respectively, can mix with unconverted light 300b from section 206 to produce a single color of visible light 302.

Either configuration of the wavelength covered light-emitting sections can be used to produce white light. In one embodiment, the white light can be tuned by slightly increasing or decreasing the amount of forward current to the light-emitting device. In another embodiment, the white light can be tuned by varying the thickness and selection of the wavelength converting materials deposited on the light-emitting sections.

Figure 4:
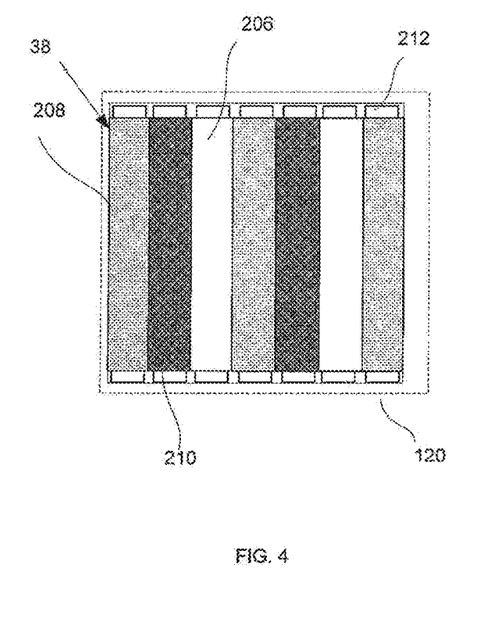
FIG. 4 is a top-view of the light-emitting device in accordance with one embodiment.

FIG. 4 illustrates a top-view of the light-emitting device with seven light-emitting and independently addressable sections, in accordance with one embodiment. Seven light-emitting and independently addressable sections are created on the light-emitting diode. In one embodiment, each section 208, 206 and 210 contains one of three wavelength converting materials. Alternatively one or more of the sections are devoid of wavelength converting materials. The three wavelength converting materials are then repeated in an alternating pattern. In another embodiment, each of the seven sections is deposited with a different wavelength converting material. Each of the seven sections emits a wavelength converted light that mixes together with wavelength converted light from the other sections to produce a single color of visible light. A larger number of isolated and independently addressable sections could result in a more balanced white light with a higher color rendering index and a good luminous efficacy.

In one embodiment, instead of addressing the isolated section through electrical connections 204, isolated bond pads can be formed on the light emission surface 38. These bond pads can be formed by a number of methods including directly plating the copper bond pads on the emission surface.

Figure 5A:
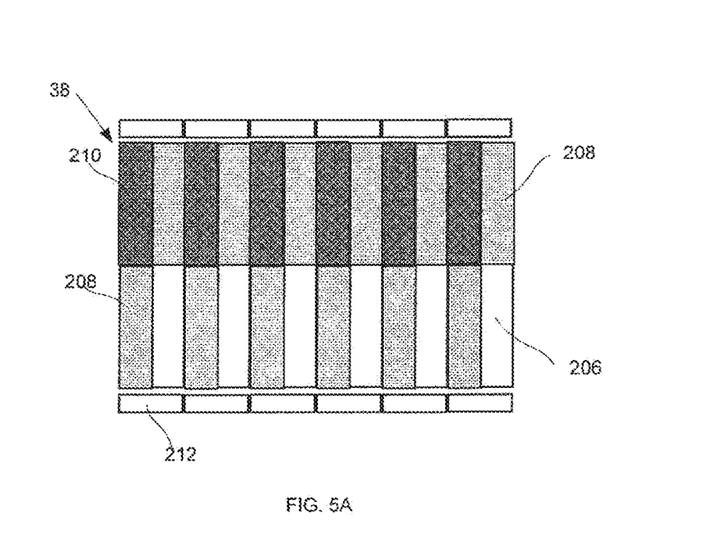
FIG. 5A is a top-view of a light-emitting device in accordance with one embodiment.

FIG. 5A illustrates a top-view of the surface emission area of FIG. 2A with light-emitting and independently addressable sections that are arranged into a pattern, in accordance with one embodiment. Twenty four light-emitting and independently addressable sections are created on emission surface of the light-emitting diode. In one embodiment, each of the 24 sections contains one of three wavelength converting materials. The three wavelength converting materials are then repeated in an alternating pattern. Each of the 24 sections emits light that has been a converted by the wavelength converting material. The converted light can mix together with converted light from the other sections to produce a single color of visible light. The area allocated to each section can be greater than about 200 micron (e.g. greater than about 300 micron, greater than about 400 micron or greater than about 500 micron). It should be noted that the present invention is not limited to the pattern or the number of wavelength converting materials presented. Any pattern of wavelength converting materials and sections that produces a single color light of desired color point could be used. In another embodiment, each section of the 24 light-emitting and independently addressable sections could belong to a partition 218 consisting of a number of isolated sections. Each of these partitions could be independently addressable.

Figure 5B:
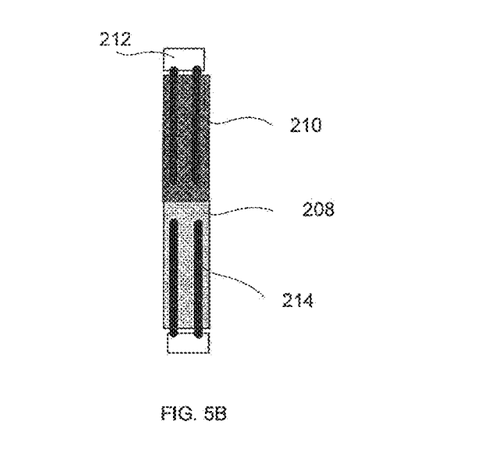
FIG. 5B is a top-view of one of the section of the pattern of FIG. 5A with broken electrically conductive fingers, in accordance with one embodiment.

FIG. 5B illustrates a top-view of one of the section of the pattern of FIG. 5A with broken electrically conductive fingers, in accordance with one embodiment. FIG. 5B shows how each of the 24 sections could be independently addressable. In one embodiment, electrically conductive fingers 216 may extend from the isolated contact pad 212 and along the surface 38, thereby allowing for current injection into each of the sections of the light-emitting device. Electrically conductive fingers may be separated, thereby creating less likelihood of electric short between the different sections. Electrically conductive fingers may be separated by a distance greater than 100 um (e.g. greater than 200 um, greater than 300 um).

Figure 6:
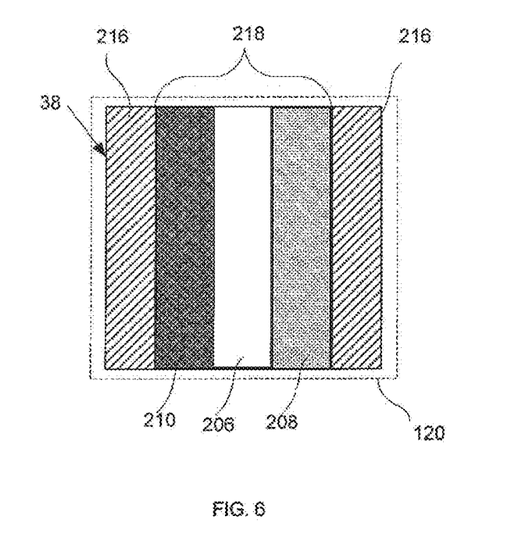
FIG. 6 is a top-view of the light-emitting device in accordance with one embodiment.

FIG. 6 illustrates a top-view of the light-emitting device with five light-emitting and independently addressable sections, in accordance with one embodiment. Five light-emitting and independently addressable sections are formed on emission surface of the light-emitting device. Sections 210, 206 and 208 may be deposited with a wavelength converting material and are configured to producing white light. Sections 216 can also contain wavelength converting material and are allocated to color balancing the white light. In one embodiment, the sections of light-emitting diode that are allocated to produce white light cover a larger area of the light-emitting diode than the area of the sections that are allocated to color balancing. In another embodiment, one or more of the section either configured to producing white light or to color balancing may be devoid of phosphor. In another embodiment the sections allocated to producing white light could form a partition 218. Rather than individually addressing the sections of within the partition, the partition 218 may be electrically addressable.

It should be understood that the light-emitting devices may have a number of other configurations. For example, any suitable number of independently electrically addressable light-emitting sections may be included. Depending on the desired light emission, any number of these sections may, or may not, include a wavelength converting material layer.

In one set of embodiments, the light-emitting die 120 may be encased by an encapsulant. The encapsulant may fill the area between the light emission surface and the top most feature of the package layer 108 of the light-emitting device. In one embodiment, the encapsulant may be comprised of a transparent material, but may not contain any optical features and may serve only as a protective layer. In another embodiment, the encapsulant may comprise a close proximity optical element. The close proximity optical element may form a wide variety of structures known to persons skilled in optical technology. The optical element may be square or rectangular, circular, symmetrical or non-symmetrical, regular or irregular.

Figure 7A:
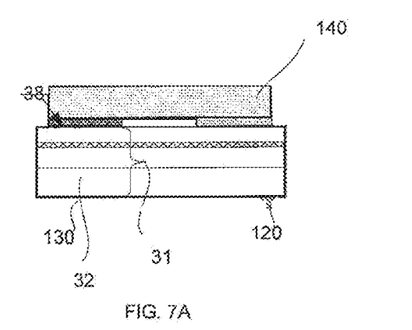
FIGS. 7A-7C are cross-sectional views of a light-emitting device with a close proximity optical element in accordance with different embodiments.
Figure 7B:
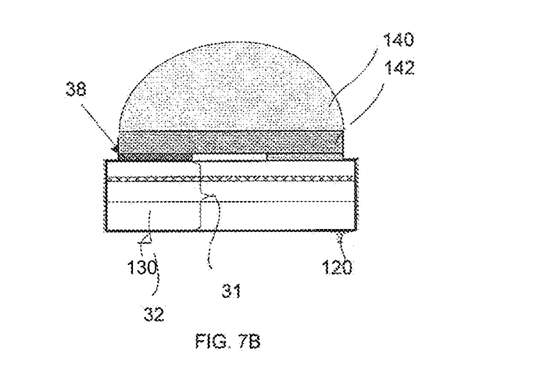

FIG. 7A shows a tunable light-emitting device incorporating a flat rectangular window as the close proximity optical element. In this embodiment, the encapsulant 140 may serve as a close proximity optical element that is optically coupled to the light emission surface. The optical element 140 may comprise a transparent shell encapsulating the diode. In one embodiment, the transparent shell has a rigid material on the outside and optically transmissive material on the inside of the shell. The optically transmissive material can be at least partially transparent and preferably has a relatively high refractive index. Suitable materials for the optical element can include inorganic materials such as high index glasses and ceramics. FIG. 7A shows the optical element 140 forming a flat rectangular window that is on the same level as top most feature of the package layer 106. FIG. 7B shows another embodiment of an optical element that forms a dome like shape completely encapsulating the diode.

In some embodiments, an index matching layer (e.g., having similar refractive index as the optical element) is disposed on the emission surface of the light-emitting diode. In some embodiments, a substantial portion of the optical element has an index of to refraction of less than about 1.4. In some embodiments, the index matching layer may be used to fill the gap between the light-emitting surface and the optical element. FIG. 7B shows the index matching layer 142 between the light-emitting surface of the light-emitting die 120 and the optical element 140.

In other embodiments, the index matching layer may also be a binder material to attach the optical element to the light-emitting diode. The index matching layer may be injected, wicked, or otherwise inserted into the partially enclosed cavity using methods known in the art and then sealed off using an epoxy or cured wherein index matching material seals the cavity itself.

Various binder materials may include epoxies, glues, silicon-based adhesives and other common binding materials known to those skilled in the art of attaching materials together. Those materials are either made of the same substance or of a different substance, which affects the choice of a proper binding material. Some of these binding materials have different methods for curing. For example a thermosetting epoxy may require being heated to 150 degrees Celsius for a specified period of time in order to fully be fully cured. Other adhesives may cure with time, while the curing process with additional adhesives may be expedited by applying UV light.

These binding materials can have ideal properties for refractive-index matching between optical interfaces. The refractive index of a light-emitting surface of an LED will be different than that of air or glass. By adding an index matching material the angle of incidence at the optical interface can be reduced, thus enabling more light to pass through the interface as less light is internally reflected at the interface.

Figure 7C:
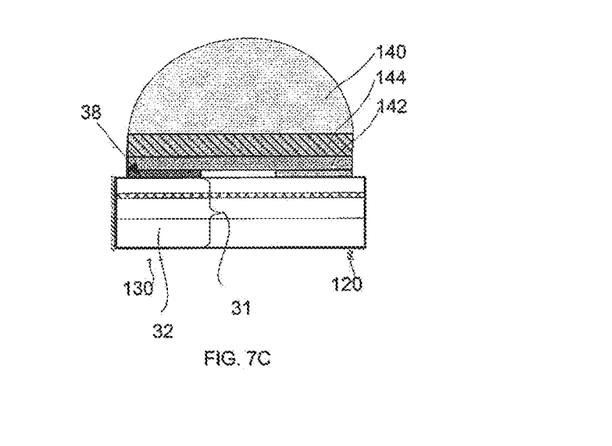

In some embodiments, the close proximity optical element comprises one or more light extraction features. The light extraction features can transmit, diffuse, homogenize, scatter and/or emit some or all of the light transmitted therein. In other embodiment, the optical element comprises a light homogenization region that substantially and uniformly distributes light outputted by the light-emitting device. FIG. 7C shows an optical element with a light homogenization region 144. The homogenization region is formed between the index matching layer 142 and the optical element 140. The index matching layer 142 would be index matched both to the light homogenization region and optical element.

The light-emitting device as described above could be incorporated into a system that remotely controls the color of the single visible light produced. The color control can to be implemented dynamically or in a closed loop by monitoring the overall output color of the system and powering the individual sections accordingly. Alternatively color control could be implemented manually or in an open loop through user or machine control.

Figure 8:
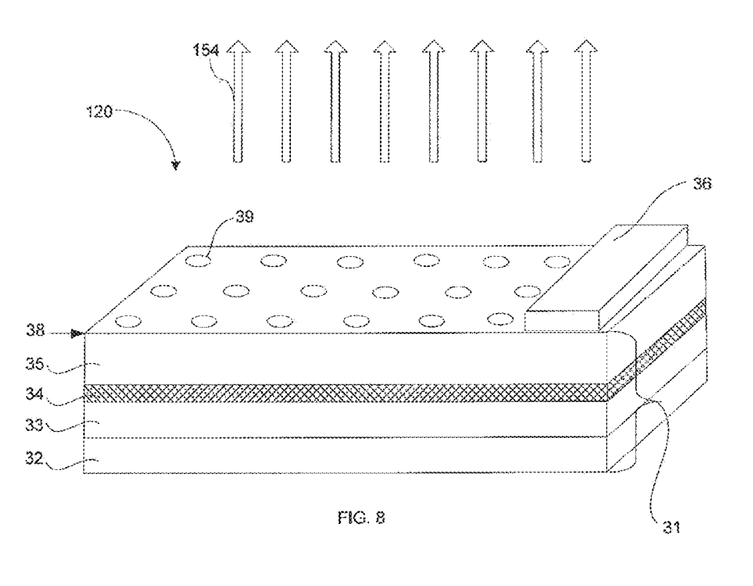
FIG. 8 is a perspective view of a light-emitting diode, in accordance with one embodiment.

FIG. 8 illustrates a section of a light-emitting diode (LED) which may be one example of a section of a light-emitting die, in accordance with one embodiment. It should be understood that various embodiments presented herein can also be applied to other light-emitting dies, such as laser diode dies, and LED dies having different structures (such as organic LEDs, also referred to as OLEDs). LED die 120 shown in FIG. 8 comprises a multi-layer stack 31 that may be disposed on a support structure (not shown). The multi-layer stack 31 can include an active region 34 which is formed between n-doped layer(s) 35 and p-doped layer(s) 33. The stack can also include an electrically conductive layer 32 which may serve as a p-side contact, which can also serve as an optically reflective layer. An n-side contact pad 36 may be disposed on layer 35. Electrically conductive fingers (not shown) may extend from the contact pad 36 and along the surface 38, thereby allowing for uniform current injection into the LED structure. It should be understood that other sections of the LED may include separate contacts as described above.

It should be appreciated that the LED is not limited to the configuration shown in FIG. 8, for example, the n-doped and p-doped sides may be interchanged so as to form a LED having a p-doped region in contact with the contact pad 36 and an n-doped region in contact with layer 32. As described further below, electrical potential may be applied to the contact pads which can result in light generation within active region 34 and emission (represented by arrows 154) of at least some of the light generated through an emission surface 38. As described further below, holes 39 may be defined in an emission surface to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 35 can include a silicon-doped GaN layer (e.g., having a thickness of about 4000 nm thick) and/or the p-doped layer(s) 33 include a magnesium-doped GaN layer (e.g., having a thickness of about 40 nm thick). The electrically conductive layer 32 may be a silver layer (e.g., having a thickness of about 100 nm), which may also serve as a reflective layer (e.g., that reflects upwards any downward propagating light generated by the active region 34). Furthermore, although not shown, other layers may also be included in the LED; for example, an AlGaN layer may be disposed between the active region 34 and the p-doped layer(s) 33. It should be understood that compositions other than those described herein may also be suitable for the layers of the LED.

As a result of holes 39, the LED can have a dielectric function that varies spatially according to a pattern. Typical hole sizes can be less than about one micron (e.g., less than about 750 nm, less than about 500 nm, less than about 250 nm) and typical nearest neighbor distances between holes can be less than about one micron (e.g., less than about 750 nm, less than about 500 nm, less than about 250 nm). Furthermore, as illustrated in the figure, the holes 39 can be non-concentric.

The dielectric function that varies spatially according to a pattern can influence the extraction efficiency and/or collimation of light emitted by the LED. In some embodiments, a layer of the LED may have a dielectric function that varies spatially according to a pattern. In the illustrative LED die 120 of FIG. 8, the pattern is formed of holes, but it should be appreciated that the variation of the dielectric function at an interface need not necessarily result from holes. Any suitable way of producing a variation in dielectric function according to a pattern may be used. For example, the to pattern may be formed by varying the composition of layer 35 and/or emission surface 38. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. As used herein, peak wavelength refers to the wavelength having a maximum light intensity, for example, as measured using a spectroradiometer. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference in its entirety). In some embodiments, a device may include a roughened surface. The surface roughness may have, for example, a root-mean-square (rms) roughness about equal to an average feature size which may be related to the wavelength of the emitted light.

In certain embodiments, an interface of a light-emitting device is patterned with holes which can form a photonic lattice. Suitable LEDs having a dielectric function that varies spatially (e.g., a photonic lattice) have been described in, for example, U.S. Pat. No. 6,831,302 B2, entitled "Light-emitting devices with improved extraction efficiency," filed on Nov. 26, 2003, which is herein incorporated by reference in its entirety. A high extraction efficiency for an LED implies a high power of the emitted light and hence high brightness which may be desirable in various optical systems.

It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. Patent to Publication No. 20070085098, entitled "Patterned devices and related methods," filed on Mar. 7, 2006, which is herein incorporated by reference in its entirety.

Light may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned surface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high light output power. As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total optical power divided by the emission area. In some embodiments, the total power flux is greater than 0.03 Watts/mm$^2$, greater than 0.05 Watts/mm$^2$, greater than 0.1 Watts/mm$^2$, or greater than 0.2 Watts/mm$^2$. However, it should be understood that the LEDs used in systems and methods presented herein are not limited to the above-described power and power flux values.

Figure 9:
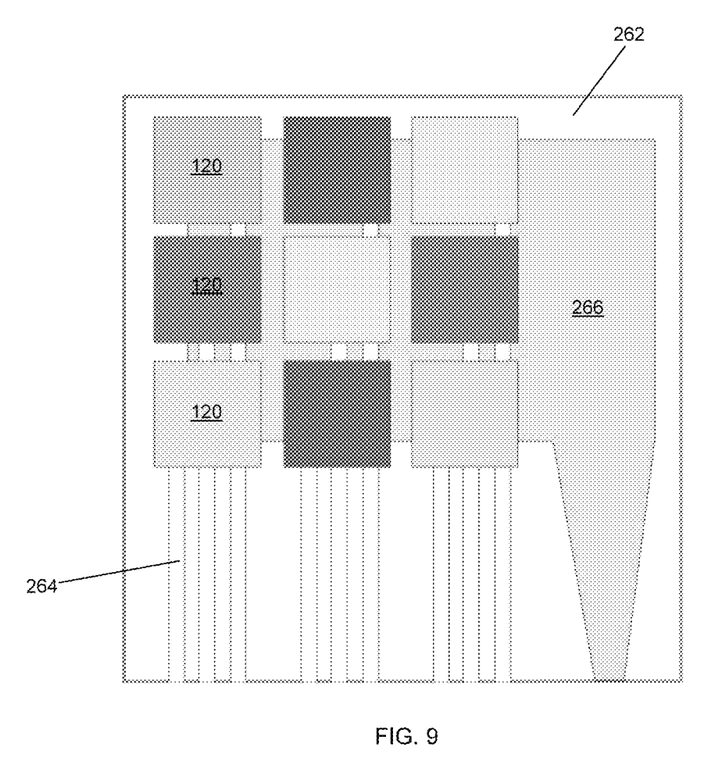
FIG. 9 is a view illustrating an array of light-emitting diodes in accordance with one embodiment.

FIG. 9 illustrates an array of light-emitting die 120. The die are arranged in a flip-chip design on a substrate 262. Each of the light-emitting die are electrically addressable via electrical connection lines 264 connected to respective electrical contacts (not shown) associated with each die. The die share a common backside electrical contact 266.

In some embodiments, the light-emitting devices may be packaged.

The light-emitting devices described herein may be used in a variety of systems and applications. For example, the light-emitting devices may be used in illumination assemblies. Suitable illumination assemblies have been described, for example, in commonly-owned U.S. Pat. No. 7,450,311 which is incorporated herein by reference in its entirety. The light-emitting devices may also be used in general lighting assemblies. Suitable systems have also been described, for example, in commonly-owned U.S. Pat. No. 7,166,871 which is incorporated herein by reference in its entirety.

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

Having thus described several aspects of at least one embodiment of this invention, it is to be appreciated various alterations, modifications, and improvements to will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A light-emitting device, comprising:
a light-emitting diode designed to emit light, the light-emitting diode including at least a first light-emitting section and a second light-emitting section,
the first and second light-emitting sections configured to be independently electrically addressable,
at least one of the light-emitting sections including a wavelength converting material layer through which light passes.

2. The device of claim 1, wherein light emitted from the first light-emitting section has a different wavelength than light emitted from the second light-emitting section.

3. The light-emitting device of claim 1, wherein light emitted from the first light-emitting section has a different color temperature than light emitted from the second light-emitting section.

4. The light-emitting device of claim 1, further comprising an array of light-emitting diodes, wherein the light-emitting diodes in the array include at least a first light-emitting section and a second light-emitting section, the first and second light-emitting sections are configured to be independently electrically addressable.

5. The light-emitting device of claim 1, wherein the light-emitting diode includes at least five light-emitting sections configured to be independently electrically addressable.

6. The light-emitting device of claim 1, wherein at least two of the light-emitting sections include a wavelength converting material layer through which light passes.

7. The light-emitting device of claim 1, wherein the light-emitting diode is configured to emit white light.

8. The light-emitting device of claim 7, wherein light emitted from each of the light-emitting sections is combined to form the white light.

9. The light-emitting device of claim 1, wherein at least one of the light-emitting sections is configured to emit light to color balance the light emission from the light-emitting diode.

10. The light-emitting device of claim 1, wherein the light emitted from each of the light-emitting sections is mixed to produce a single color of visible light.

11. The light-emitting device of claim 1, wherein the single light-emitting die has a light emission surface greater than one square millimeter.

12. The light-emitting device of claim 1, wherein the wavelength converting material comprises a phosphor material.

13. The light-emitting device of claim 1, wherein the area of the first and second light-emitting sections is greater than about 200 micron.

14. The light-emitting device of claim 1, further comprising a submount, wherein the light-emitting diode is mounted on the submount.

15. The light-emitting device of claim 1, wherein at least one of the light-emitting sections is devoid of wavelength converting material.

16. The light-emitting device of claim 1, wherein the light-emitting diode comprises a first light-emitting section comprising a red wavelength converting material layer;
- a second light-emitting section comprising an amber or yellow-green wavelength converting material; and
- a third light-emitting section devoid of wavelength converting material positioned adjacent to at least one of the other light-emitting sections.

17. The light-emitting device of claim 1, further comprising a close proximity optical element disposed over at least a portion of the light emission area in the optical pathway of the emitted light.

18. An illumination assembly including a light-emitting device as in claim 1.

19. A light-emitting device, comprising:
- a light-emitting diode designed to emit light, the light-emitting diode including at least a first light-emitting section and a second light-emitting section,
- each of the first and the second light-emitting sections having two electrical contacts associated therewith, wherein at least one of the electrical contacts associated with the first light-emitting section is different than the electrical contacts associated with the second light-emitting section,
- at least one of the light-emitting sections including a wavelength converting material layer,
- wherein light emitted from the first light-emitting section has a different wavelength than light emitted from the second light-emitting section.

20. A method comprising:
- providing a light-emitting device comprising a light-emitting diode designed to emit light, the light-emitting diode including at least a first light-emitting section and a second light-emitting section, at least one of the light-emitting sections including a wavelength converting material layer through which light passes; and
- providing current to the first light-emitting section separately from providing current to the second light-emitting section.

21. The method of claim 20, wherein the light emitted from the first light-emitting section has a different wavelength than light emitted from the second light-emitting section.

22. The method of claim 20, wherein a different current level is provided to the first light-emitting section than the second light-emitting section.

23. The method of claim 22, further comprising controlling the current levels provided to the first light-emitting section and the second light-emitting section to control the wavelength of the light emitted by the light-emitting diode.

* * * * *